United States Patent
Paranjpe et al.

(10) Patent No.: US 6,645,847 B2
(45) Date of Patent: *Nov. 11, 2003

(54) MICROELECTRONIC INTERCONNECT MATERIAL WITH ADHESION PROMOTION LAYER AND FABRICATION METHOD

(75) Inventors: Ajit P. Paranjpe, Sunnyvale, CA (US); Mehrdad M. Moslehi, Los Altos, CA (US); Boris Relja, Pleasanton, CA (US); Randhir S. Bubber, San Ramon, CA (US); Lino A. Velo, San Ramon, CA (US); Thomas R. Omstead, Fremont, CA (US); David R. Campbell, Sr., Rochester, NY (US); David M. Leet, Pittsford, NY (US); Sanjay Gopinath, Fremont, CA (US)

(73) Assignee: CVC Products, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/060,548

(22) Filed: Jan. 30, 2002

(65) Prior Publication Data

US 2002/0102838 A1 Aug. 1, 2002

Related U.S. Application Data

(63) Continuation of application No. 09/518,294, filed on Mar. 3, 2000, now Pat. No. 6,365,502, which is a continuation-in-part of application No. 09/219,147, filed on Dec. 22, 1998, now Pat. No. 6,294,836.

(51) Int. Cl.[7] .......................................... H01L 21/4763

(52) U.S. Cl. ..................... 438/622; 438/687

(58) Field of Search ................. 438/618, 620, 438/626, 627, 628, 622, 637, 643, 644, 645, 680, 681, 687

(56) References Cited

U.S. PATENT DOCUMENTS

| 4,510,182 A | 4/1985 | Cornils et al. ............... 427/162 |
| 4,789,598 A | 12/1988 | Howard et al. ............. 428/408 |
| 4,792,378 A | 12/1988 | Rose et al. .................. 156/643 |
| 4,825,809 A | 5/1989 | Mieno ........................ 118/725 |
| 4,929,468 A | 5/1990 | Mullendore .................. 427/47 |
| 4,938,999 A | 7/1990 | Jenkin ........................ 427/436 |

(List continued on next page.)

FOREIGN PATENT DOCUMENTS

| EP | 0093971 A2 | 4/1983 | ........... H01L/29/40 |
| EP | 0297348 A1 | 1/1989 | ........... C23C/16/18 |
| EP | 0698918 A1 | 2/1996 | ....... H01L/21/3205 |
| EP | 0725439 A2 | 8/1996 | ......... H01L/23/532 |
| EP | 0881673 A2 | 12/1998 | ......... H01L/21/768 |

OTHER PUBLICATIONS

"Selectivety in low pressure chemical vapor deposition of copper from hexafluororoacetylacetonate-copper(I)–trimethylvinylsilane in the presence of water," by Strumm et al. in *Materials Science and Engineering*, B23 1994, pp. 48–53, Feb. 1994.

(List continued on next page.)

*Primary Examiner*—David Nelms
(74) *Attorney, Agent, or Firm*—Baker Botts L.L.P.

(57) ABSTRACT

A microelectronic semiconductor interconnect structure barrier and method of deposition provide improved conductive barrier material properties for high-performance device interconnects. The barrier includes a refractory metal such as cobalt, cobalt-based alloys, ruthenium or ruthenium-based alloys for promoting adhesion of copper. The barrier materials can be deposited by chemical-vapor deposition to achieve good step coverage and a relatively conformal thin film with a good nucleation surface for subsequent metallization such as copper metallization. In one embodiment, the barrier suppresses diffusion of copper into other layers of the device, including the inter-metal dielectric, pre-metal dielectric, and transistor structures.

22 Claims, 1 Drawing Sheet

U.S. PATENT DOCUMENTS

| | | | | |
|---|---|---|---|---|
| 4,948,623 | A | | 8/1990 | Beach et al. .................. 427/35 |
| 4,965,656 | A | | 10/1990 | Koubuchi et al. ............ 357/71 |
| 4,970,093 | A | | 11/1990 | Sievers et al. ................ 427/38 |
| 5,079,600 | A | * | 1/1992 | Schnur et al. ................. 357/4 |
| 5,082,542 | A | | 1/1992 | Moslehi et al. ........ 204/192.32 |
| 5,085,731 | A | | 2/1992 | Norman et al. ............. 156/646 |
| 5,098,516 | A | | 3/1992 | Norman et al. ............. 156/666 |
| 5,112,448 | A | | 5/1992 | Chakravorty ............... 205/118 |
| 5,171,610 | A | | 12/1992 | Liu ............................ 427/586 |
| 5,231,751 | A | | 8/1993 | Sachdev et al. ............. 29/852 |
| 5,268,034 | A | | 12/1993 | Vukelic ...................... 118/719 |
| 5,312,509 | A | | 5/1994 | Eschbach .................... 156/345 |
| 5,354,712 | A | | 10/1994 | Ho et al. .................... 437/195 |
| 5,453,124 | A | | 9/1995 | Moslehi et al. ............. 118/715 |
| 5,464,656 | A | | 11/1995 | Verkade .................. 427/248.1 |
| 5,592,024 | A | | 1/1997 | Aoyama et al. ............ 257/751 |
| 5,594,278 | A | | 1/1997 | Uchiyama ................... 257/751 |
| 5,595,606 | A | | 1/1997 | Fujikawa et al. ........... 118/725 |
| 5,624,498 | A | | 4/1997 | Lee et al. ................... 118/715 |
| 5,674,787 | A | | 10/1997 | Zhao et al. ................. 437/230 |
| 5,689,227 | A | | 11/1997 | Nguyen et al. ............. 338/308 |
| 5,723,028 | A | | 3/1998 | Poris .......................... 204/231 |
| 5,723,387 | A | | 3/1998 | Chen .......................... 438/692 |
| 5,730,801 | A | | 3/1998 | Tepman et al. ............. 118/719 |
| 5,736,191 | A | | 4/1998 | Biernath ...................... 427/96 |
| 5,755,859 | A | | 5/1998 | Brusic et al. .............. 106/1.22 |
| 5,763,953 | A | | 6/1998 | Iijima et al. ................ 257/762 |
| 5,766,379 | A | | 6/1998 | Lanford et al. ............. 148/537 |
| 5,789,321 | A | | 8/1998 | Ohshita ...................... 438/680 |
| 5,792,593 | A | | 8/1998 | McClure et al. ............ 430/314 |
| 5,824,590 | A | | 10/1998 | New .......................... 438/393 |
| 5,843,516 | A | | 12/1998 | Derbenwick et al. ......... 427/96 |
| 5,852,088 | A | | 12/1998 | Dismukes et al. .......... 524/175 |
| 5,866,237 | A | | 2/1999 | Angelopoulos et al. ..... 428/209 |
| 5,891,348 | A | | 4/1999 | Ye et al. ...................... 216/67 |
| 5,891,513 | A | | 4/1999 | Dubin et al. ................ 427/98 |
| 5,916,359 | A | | 6/1999 | Baum et al. ........... 106/287.18 |
| 5,948,467 | A | | 9/1999 | Nguyen et al. ............... 427/99 |
| 5,969,422 | A | | 10/1999 | Ting et al. .................. 257/762 |
| 6,015,917 | A | | 1/2000 | Bhandari et al. ............. 556/12 |
| 6,054,227 | A | | 4/2000 | Greenberg et al. .......... 428/701 |
| 6,057,237 | A | | 5/2000 | Ding et al. .................. 438/687 |
| 6,063,506 | A | | 5/2000 | Andricacos et al. ........ 428/546 |
| 6,136,682 | A | | 10/2000 | Hegde et al. ............... 438/622 |
| 6,181,012 | B1 | | 1/2001 | Edelstein et al. ........... 257/762 |
| 6,294,836 | B1 | * | 9/2001 | Paranjpe et al. ............ 257/767 |
| 6,365,502 | B1 | * | 4/2002 | Paranjpe et al. ............ 438/622 |
| 6,444,263 | B1 | * | 9/2002 | Paranjpe et al. |

OTHER PUBLICATIONS

English language translation of Abstract for Japanese Patent Application 07057312; Mar. 3, 1995.

"Chemical vapor deposited TiCN: A new barrier metallization for submicron via and contact applications," by Eizenberg et al. in the *Journal of Vacuum Science and Technology*: Part A, U.S., American Institute of Physics, New York, May 1, 1995.

"Chemical vapor deposition TiN process for contact/via barrier applications" by Paranjpe et al. in the *Journal of Vacuum Science and Technology*: Part B, U.S., American Institute of Physics, New York, Sep. 1, 1995.

English language translation of Abstract from Japanese Patent Application No. 10092977; Mar. 4, 1997.

English language translation of Abstract from Japanese Patent Application No. 10242409; Apr. 30, 1997.

English language translation of Abstract from Japanese Patent application No. 06203379; Jul. 22, 1997.

"An Evaluation of Cu Wiring in a Production 64Mb DRAM," by Cote et al. IBM Semiconductor Research and Development Center, IBM Microelectronics Division, Hopewell Junction, NY, *1998 Symposium on VLSI Technology Digest of Technical Papers*, pp. 24–25, Jun. 1998.

"A High Performance 3.97 $\mu^2$ CMOS SRAM Technology Using Self–Aligned Local Interconnect and Copper Interconnect Metalization," by Woo, et al. Networking and Computing Systems Group, Process Technology Development, Motorola Inc., Austin, Texas, *1998 Symposium on VLSI Technoloy Digest of Technical Papers*, pp. 12–13, Jun. 1998.

"A Cu/Low–k Dual Damascene Interconnect for high Performance and Low Cost Integrated Circuits" by Zhao et al. Rockwell Semiconductor Systems, 4311 Jamboree Road, Newport Beach, CA, *1998 Symposium on VLSI Technology Digest of Technnical Papers*, pp. 28–29, Jun. 1998.

"A High–Performance Sub–0.23 $\mu$m CMOS Technology with Multiple Thresholds and Copper Interconnects" by Schulz et al. IBM Semiconductor Research and Development Center, Hopewell Junction, NY *1998 Symposium on VLSI Technoloy Digest of Technical Papers*, pp. 18–19, Jun. 1998.

"An Inlaid CVD Cu Based Integration for Sub 0.23 $\mu$m Technology" by Denning et al. Advanced Products Research and Development Laboratory, Motorola, 3501 Ed Bluestein Blvd., Austin, TX, *1998 Symposium on VLSI Technology Digest of Technical Papers*, pp. 22–23, Jun. 1998.

"The Effects of Processing Parameters in the Chemical Vapor Deposition of Cobalt from Cobalt TriCarbonyl Nitrosyl," by Ivanova et al. in the *Journal of the Electrochemical Society*, vol. 146 pp 2139–2145, Revised Dec. 22, 1998.

Communication relating to the results of the Partial International Search for PUT/US 99/15583, Dec. 20, 1999.

PCT International Search PCT/US 99/15583, Apr. 17, 2000.

PCT International Search Report for PCT/US 99/30662, May 23, 2000.

Written Opinion for PCT Application No. US 99/30662, Nov. 27, 2000.

* cited by examiner

MICROELECTRONIC INTERCONNECT MATERIAL WITH ADHESION PROMOTION LAYER AND FABRICATION METHOD

CROSS REFERENCE TO RELATED APPLICATIONS

This application is a continuation of application Ser. No. 09/518,294 filed by Ajit P. Paranjpe et al. on Mar. 3, 2000 entitled "Microelectronic Interconnect Material with Adhesion Promotion Layer and Fabrication Method," now U.S. Pat. No. 6,365,502, which is a continuation-in-part and claims priority from application Ser. No. 09/219,147 filed by Ajit P. Paranjpe et al. on Dec. 22, 1998 entitled "Semiconductor Chip Interconnect Barrier Material and Fabrication Method," now U.S. Pat. No. 6,294,836.

TECHNICAL FIELD OF THE INVENTION

This invention relates in general to the field of semiconductor electronic devices, and more particularly to an improved microelectronic interconnect copper metallization structure having a cobalt-based or ruthenium-based adhesion promotion layer between diffusion barrier and copper layers and method of fabricating the same.

BACKGROUND OF THE INVENTION

Microelectronic semiconductor integrated circuit chip fabrication technology has focused on techniques and materials to produce smaller and faster devices with increasing packing densities for higher performance chips. This trend towards miniaturization has led to demand for improved semiconductor integrated circuit (IC) interconnect performance and improved manufacturability, resulting in a shift from conventional $Al/SiO_2$ interconnect architectures to copper-based metallization in conjunction with low-permitivity (or low-k) dielectrics. Compared to aluminum, Copper metallization reduces interconnect propagation delays, reduces cross-talk, and enables higher interconnect current densities with extended electro migration lifetime. When combined with low-k dielectrics, copper metallization can also decrease the number of metallization levels, resulting in reduced chip manufacturing costs. For instance, the superior electro migration performance and lower resistivity of copper compared to aluminum, permits a reduction in metal stack height that results in reduced signal cross-talk and improved interconnect speed.

A number of deposition methods, such as chemical-vapor deposition (CVD), physical-vapor deposition (PVD), and electrochemical deposition (ECD) or plating can be used for deposition of uniform thin-film copper layers. Chemical-vapor deposition, in particular, provides a number of advantages over other deposition techniques, including the capability for fully vacuum cluster integrated deposition of the diffusion barrier and copper layers through cluster tool equipment. Metal-organic CVD (MOCVD) is a particularly desirable means for deposition of copper due to its excellent gap-fill characteristics, such as is desirable for high-aspect ratio via holes and trenches, its excellent step coverage, its compatibility with single/dual damascene processing, and its relatively low thermal budget, such as less than 250° C. deposition process temperature, which helps ensure compatibility with low-k polymer dielectrics. Due to these advantages, as device dimensions shrink, MOCVD technology is likely to replace other deposition techniques as the preferred solution for deposition of uniform high-conductivity copper layers.

Although copper provides a number of advantages for microelectronic semiconductor chip performance, significant difficulties exist in depositing and reliably integrating copper layers on a substrate. One difficulty relates to rapid diffusion of copper atoms through many materials, including both metals and dielectrics. Copper tends to diffuse through device materials during the thermal cycling that a semiconductor substrate experiences during the multi-level interconnect fabrication process flow, as well as during actual chip operation under applied electric fields. Copper diffusion into and/or through the inter-metal dielectric (IMD) results in current leakage between adjacent metal lines, known as line-to-line leakage. Copper diffusion through the IMD and pre-metal dielectric (PMD) or inter-level dielectric (ILD) and into the transistor regions results in degraded device characteristics such as accelerated aging and, potentially, non-functional transistor and chips.

Another difficulty associated with copper in microelectronic device fabrication, such as semiconductor IC fabrication, is the sufficient adhesion of the copper to the underlying barrier to prevent copper delamination during subsequent chemical-mechanical polishing (CMP). Moreover, copper is prone to corrosion and must be passivated. Non-conducting diffusion barriers, such as $Si_3N_4$, are ideal for passivation and prevention of copper diffusion between metallization layers. However, for many applications, a conducting barrier is necessary. For instance, a conducting barrier is necessary to enable electrical current flow between via plugs and lower level metal lines. To reduce copper diffusion and corrosion, a number of advanced diffusion barriers have been developed to supplant traditional barriers used with aluminum and tungsten metallization, such as TiN and TiW barriers. For instance, some barrier materials proposed for use with copper metallization include Ta, TaN, $WN_x$, and ternary barrier materials such as TiSiN, TaSiN, WSiN, and WBN. Although these barriers improve reliability of copper metallization in microelectronic devices, these conventional barriers have some significant difficulties including poor adhesion with as deposited copper and sometimes with other adjacent layers, such as low-K dielectrics.

Other potential problems associated with copper metallization include difficulties associated with the deposition process for depositing copper and barrier layers onto the substrate. The deposition of a barrier layer using conventional barrier materials and deposition techniques may have difficulty achieving a good nucleation surface to promote <111> texture in an overlying copper layer for improved electro migration lifetime, and good step coverage in high-aspect-ratio features so that barrier thickness on the sidewall and bottom of trenches and via holes is comparable to barrier thickness in the field. In addition, conventional barrier materials and deposition techniques tend to have increased resistivity, especially as deposition temperatures are lowered to below 380° C.

The adhesion and uniform nucleation of CVD Cu on commonly used PVD and CVD barriers is problematic. Organometallic precursors used for CVD Cu tend to prematurely decompose on the barrier surface at the initiation of the deposition, which results in non-uniform nucleation with long nucleation delays as well as poor adhesion. This problem is exacerbated as the CVD Cu thickness is scaled to 100–250 Å. For applications as a seed layer for subsequent electroplating, the CVD Cu thickness cannot exceed 15–20% of the feature size to be electroplated. For example, 0.1 m structures correspond to 150–200 Å CVD Cu thin film. For such thin seed films, long and variable nucleation delays (typically 30–60 s) lead to poor process repeatability as well as to discontinuous films within the high aspect ratio features. Adhesion of these films to the underlying barrier is also marginal leading to adhesion failure during electroplating or subsequent CMP process steps used to form the inlaid metal line and via plugs.

SUMMARY OF THE INVENTION

Therefore, a need has arisen for a barrier material and method for deposition of the barrier which reduces or suppresses copper diffusion through device layers.

A further need exists for a barrier material and method of deposition that improves adhesion of metallization layers, including adhesion of the barrier to underlying layers and adhesion of copper metallization to the barrier layer.

A further need exists for a barrier material and method of deposition that provides low resistance of the barrier layer to electrical current flow.

A further need exists for a barrier material and method of deposition that provides improved step coverage of microelectronic device features, such as a semiconductor chip interconnect structure, having high-aspect-ratio features.

A further need exists for a barrier material and method of deposition that supports deposition of low resistivity films at relatively low deposition temperatures.

A further need exists for a barrier material and method of deposition that reduces or eliminates copper corrosion.

In accordance with the present invention, a barrier material and method for deposition of the barrier are provided that substantially eliminate or reduce disadvantages and problems associated with previously developed diffusion barriers and methods of deposition. The barrier material comprises a known material such as TaN, TiN, or $WN_x$. Moreover, the barrier may comprise one or more metallic dopants selected from the group consisting of cobalt, ruthenium, platinum, palladium, iridium, rhodium, and tin. As indicated, the dopant can be combined with at least one refractory metal selected from the group consisting of tantalum, tungsten, titanium and chromium, and can also be combined with at least one element selected from the group consisting of carbon, oxygen and nitrogen. A variety of combinations of the dopant or several dopants can be used to address particular difficulties or process integration requirements associated with various device structures. Additionally, a simple binary barrier material such as TaN may also be realized by the present invention. The MOCVD technique for incorporation of the dopant provides a uniform thin film layer with good step coverage and nucleation surface. Co-deposition of the dopant with other materials at varied deposition rates allows manipulation of barrier material characteristics throughout the thickness of the barrier layer, allowing the dopant to have varying concentrations relative to other barrier materials at the barrier interface with overlying and underlying layers by depositing graded composition barrier layers.

In accordance with another aspect of the invention, a semiconductor integrated circuit interconnect structure formed on a substrate is disclosed. The interconnect structure comprises a conductive layer comprised of a metallic material and a barrier layer coupled to the substrate, the barrier layer including an adhesion region comprising a refractory metal, the adhesion region promoting adhesion of the conductive layer to the barrier layer.

In accordance with another aspect of the present invention, a method for forming a microelectronic interconnect structure on a substrate is provided. The method includes depositing a conductive layer and depositing a barrier layer, the barrier layer including an adhesion region coupled to the conductive layer. The adhesion region includes a refractory metal doped with an adhesion promotion material such as cobalt or ruthenium.

A further aspect of the invention provides a microelectronic semiconductor interconnect structure formed on a substrate. The interconnect structure includes a metal layer having copper and a barrier layer comprising a barrier material. The barrier material includes an adhesion region comprised of cobalt, ruthenium, cobalt alloy, of ruthenium alloy material for promoting adhesion between the copper layer and the barrier layer.

The present invention provides a number of important technical advantages. One important technical advantage is the reduced diffusion of copper through the barrier material, due to the thermal budget of the fabrication processes associated with the multi-level interconnect formation and during actual device operation under applied electric fields and possible thermal stress conditions.

Another important technical advantage is thermal stability so that the barrier material remains inert during processing. Another advantage that deposition temperatures can be reduced for compatibility with low-k dielectrics, typically having deposition temperatures of below approximately 375° C.

Another important technical advantage is good adhesion of the barrier material to the underlying surface as well as to the copper layer deposited over the barrier, such that the structured integrity of the interconnect structure is preserved through the device fabrication process flow and during device operation.

Another important technical advantage is good nucleation surface to promote <111> texture in the copper layer deposited on the surface, resulting in improved electro migration reliability lifetime.

Another important technical advantage is low electrical resistivity, such as 500.cm, and contact/interface resistance to the underlying metal, such as copper, so that low via plug resistance, such as R 1.5, can be achieved.

Another important technical advantage is good step coverage of the barrier material in high-aspect-ratio interconnect features so that barrier thickness on sidewall and bottom surfaces is comparable to barrier thickness in the field, allowing extendibility in terms of barrier thickness scaling.

BRIEF DESCRIPTION OF THE DRAWINGS

A more complete understanding of the present invention and advantages thereof may be acquired by referring to the following description, taken in conjunction with the accompanying drawings in which like reference numbers indicate like features and wherein.

DETAILED DESCRIPTION OF THE INVENTION

Preferred embodiments of the present invention are illustrated in the FIGUREs, like numerals being used to refer to like and corresponding parts of the various drawings.

Chemical-vapor deposition (CVD) of barrier materials provides a uniform film with a high degree of conformality and good step coverage, as is needed to support device dimensions that continue to shrink. However, conventional CVD techniques for deposition of copper films frequently fail to meet manufacturing standards due to poor adhesion of the copper layer to the underlying barrier film such as to TaN. Further, conventional CVD deposition techniques of barrier films result in relatively high electrical resistivity (e.g., 2000.cm) films as the deposition temperature is reduced to below 380° C. for compatibility with some organic low-K dielectrics. Thus, barrier deposition processes are needed to enable copper metallization both in terms of providing good adhesion for the copper film and allowing lower temperatures for deposition for reduced thermal budget processing without increased resistivity.

Figure 1A:
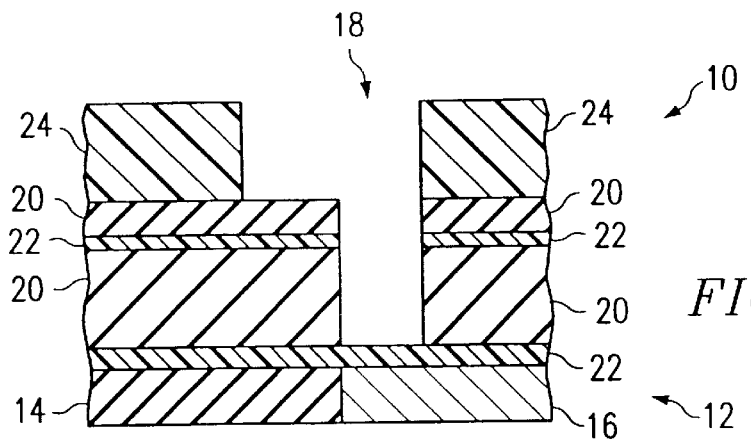
FIG. 1A depicts a side cutaway view of a microelectronic device having high-aspect-ratio features.

Referring now to FIG. 1A, a device 10 formed on a substrate layer 12 having an oxide or dielectric portion 14 and a copper portion 16. Device 10 includes a high-aspect-ratio feature 18 etched in oxide or dielectric layers 20. Oxide or dielectric layers 20 are separated by etch stop layers 22, and have photo resist layers 24 patterned on the upper most oxide layer 20. Device 10 is prepared for the second etch treatment of a dual damascene fabrication technique.

Figure 1B:
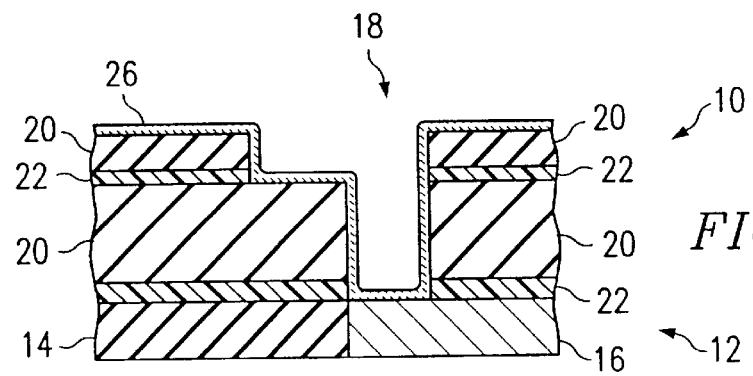
FIG. 1B depicts a side cutaway view of a microelectronic device having high-aspect-ratio features with a diffusion barrier material layer.
Figure 1C:
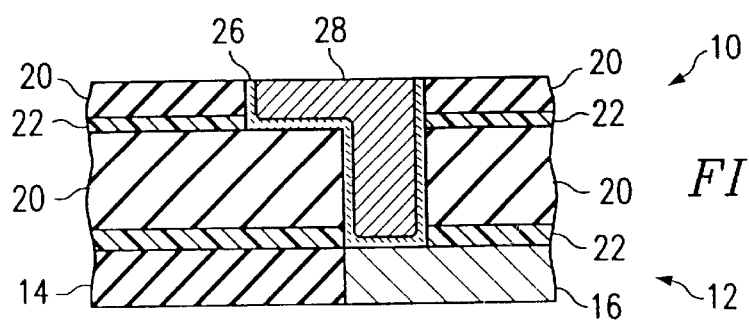
FIG. 1C depicts a side cutaway view of a microelectronic device having high-aspect-ratio features with copper deposited on the barrier layer within the features.

Device 10 of FIG. 1A is treated to etch top oxide layer 20, resulting in the formation of a via hole formation 18 depicted by FIG. 1B. A barrier layer 26 is then deposited on device 10. Deposition of barrier layer 26 using CVD or MOCVD provides uniform layer thicknesses along the side wall and bottom of feature 18 to isolate oxide layers 20. Device 10 is then in a condition to accept deposition of copper to fill feature 18. FIG. 1C depicts copper 28 deposited within feature 18 following CMP. Barrier layer 26 separates the underlying substrate 12 and oxide layers 20 from the overlying copper layer 28 to prevent diffusion of copper layer 28 into substrate 12 and oxide layers 20. If copper layer 28 were allowed to directly contact oxide within any oxide layer 20, this could result in device performance and reliability degradation as copper diffused through the oxide layer 20. However, if barrier layer 26 is conducting with minimal resistivity, current can be conducted between copper layer 16 of substrate 12 and the deposited copper layer 28 with minimal voltage drop. Once copper layer 28 is deposited, chemical-mechanical polishing (CMP) is used to smooth the upper surface of device 10. Although FIG. 1C depicts a copper layer 28 as deposited on barrier 26, it is important to note that the present invention provides a barrier to separate or encapsulate other conventional metallization material layers, such as aluminum and tungsten.

Copper metallization presents particular difficulties in terms of maintaining effective separation of copper material from a substrate or other underlying dielectric material. Non-conducting barriers based on oxide or nitride insulators, such as silicon nitride $Si_3N_4$, provide passivation and prevent copper diffusion due to their amorphous structures. However, most barrier applications for microelectronic devices require a conducting barrier. Electrically conducting barriers that include silicon, such as TiSiN, TaSiN and WSiN, or that include boron, such as WBN, can succeed at limiting copper diffusion but have relatively high resistivity values (e.g., P 1000.cm). Further, such barriers are generally deposited by physical-vapor deposition (PVD), limiting the step coverage and conformality available for these barriers and reducing their practicality as device dimensions shrink. In addition, the resistivity of CVD barriers increases to higher levels as the deposition temperature decreases below 380° C. for compatibility with certain low-K dielectrics. Also, these barriers generally have poor adhesion, limiting their usefulness, especially when chemical-mechanical polishing (CMP) is needed for device fabrication, such as in single-damascene or dual-damascene copper metallization processes.

To obtain good adhesion and reduced deposition temperature, and, in some applications, to reduce the barrier resistivity, the present invention uses one or more dopants selected from the group of platinum, palladium, iridium, rhodium, and tin to dope barrier layer 26 and tailor barrier properties for copper metallization. Some dopants can render the barrier amorphous or nano-crystalline by disrupting the crystalline structure of other materials in the barrier, such as refractory metals selected from the group of tungsten, titanium, tantalum, chromium and cobalt. For example, the alloys Co91ZrTa and Co91ZrNb are amorphous even though Co is polycrystalline in its pure form. Other nitridizing, oxidizing, or carbonizing elements selected from the group of nitrogen, oxygen and carbon can also be included in the barrier, either as an intentional controlled addition to obtain desired barrier properties or as impurities resulting from the deposition process, particularly CVD processes.

Doping the barrier with an appropriate dopant element provides a number of advantages. For instance, a suitable dopant, such as cobalt or ruthenium or platinum, enhances nucleation and adhesion of copper to enable MOCVD deposition of an overlying copper film. A suitable dopant, such as cobalt or ruthenium or platinum, also reduces resistivity of the barrier, such as MOCVD TaN layers, particularly with CVD deposited barriers. Low barrier resistance, such as less than 500.cm provide desirable low via plug resistance (e.g., R 2). Further, by rendering the barrier amorphous or nano-crystalline through disruption of the crystalline structure, the dopant provides passivation and prevents metallic diffusion between metallization layers.

Cobalt and ruthenium are examples of dopants, the addition of which to a barrier, such as MOCVD TaN, decreases the resistivity at low deposition temperatures. Cobalt and ruthenium have low diffusivity in tantalum, provides a good nucleation surface for CVD copper deposition, and improves adhesion of as-deposited MOCVD copper to the barrier for reliable chemical-mechanical polishing (CMP).

Cobalt and ruthenium enhance adhesion of copper to a barrier by reducing interfacial contamination formed during initiation of CVD copper. Copper deposition with Cu(I) precursors such as Cupraselect (Cu-hfac-tmvs) supplied by Schumacher, proceeds through adsorption of the precursor and subsequent disproportionation reaction. A parallel reaction pathway is adsorption and ligand (hfac) decomposition, resulting in interfacial contamination at the barrier/copper interface. The rate of ligand decomposition depends upon the nature of the barrier surface accepting the initial copper film. Both copper and cobalt surfaces adsorb the hfac ligand in a "standing up" mode with the hfac skeleton normal to the substrate surface. On other materials, the hfac ligand is adsorbed in a lying down mode that decomposes at 190K, compared with decomposition at 350K for standing up ligand on copper and 300K on cobalt. Uniform nucleation and adhesion occur on both copper and cobalt because the rate for disproportionation exceeds the rate for ligand decomposition. In other words, the precursor has reacted via disproportionation before ligand decomposition and interface contamination can occur. With most materials other than copper and cobalt, the threshold temperature for ligand decomposition is much lower, and the rate of ligand decomposition exceeds the rate of disproportionation leading to interface contamination at the barrier/copper interface.

Cobalt containing alloys, such as $Co_{80}Pt_{20}$, $Co_{82}Cr_8Pt_{10}$, and $Co_{75}Cr_{13}Pt_{12}$ also provide good adhesion for a subsequent copper metal layer, suggesting that cobalt contained in a material matrix can actually be at least as effective as a continuous platinum layer. Thus, doping of conventional barrier materials such as TaN, TiN and WN with cobalt can enhance the barrier properties provided through resistivity reduction and enhancement of MOCVD copper adhesion.

One conventional method for CVD of a barrier layer is thermal decomposition/thermolysis of a metal-containing precursor in an inert (Ar, He) or reducing (NH3, H2) ambient. Such deposition typically results in some level of carbon incorporation in the barrier material since many of the reaction byproducts have low volatility when metal-organic precursors are used. Carbon incorporation can lead to high barrier resistivity and sometimes unstable time-dependent barrier properties, and is generally reduced by post-deposition treatment, such as plasma treatment or thermal annealing, to remove the most volatile constituents and densify the barrier film.

One method for reducing carbon incorporation into the barrier is co-deposition of the barrier precursor and a cobalt-containing precursor in an H2 or ammonia ambient. Cobalt or platinum has catalytic qualities to encourage the hydrogenation of barrier precursor ligands to their volatile forms, leading to a cobalt-doped or platinum-doped barrier with low carbon content and deposition temperature reduction (e.g., between 10° and 30° C. for platinum). The lower deposition temperatures associated with a platinum dopant better enable integration of low-k dielectrics and improvement in step coverage. Commercial grade platinum precursors, such as MeCpPtMe3 support easy disassociation of the Pt—C bond in an H2 ambient, increasing the purity of the deposited platinum and reducing the resistivity of the composite barrier, such as TaNPt. For cobalt, the CVD process may include $Co(CO)_3NO$ as a deposition precursor.

Figure 2:
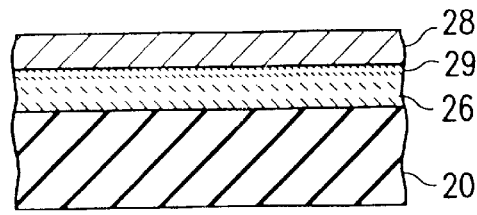
FIG. 2 depicts a side cutaway view of a barrier layer having a cobalt, ruthenium, or platinum dopant with increasing dopant density at the overlying interconnect interface compared to the underlying substrate interface.

Referring now to FIG. 2, a cobalt-containing barrier layer 26 is depicted between an underlying substrate oxide layer 20 and an overlying copper layer 28. Barrier layer 26 has a graded composition through its thickness that contains a greater proportion of cobalt adjacent to copper layer 28 than is contained adjacent to oxide layer 20. For example, barrier layer 26 could consist of a TaCoN barrier that is more cobalt rich adjacent to the copper layer to provide a good nucleation and adhesion surface for copper deposition, and that is cobalt deficient, with reduced Co doping in the bulk of barrier layer 26 to retain optimal barrier properties. Varied concentrations of cobalt through the thickness of barrier layer 26 can be achieved through co-deposition of cobalt with barrier materials, such as TiN and TaN and WN, with the deposition rate of cobalt increasing as barrier 26 is deposited. Co-deposition techniques are discussed in greater detail in U.S. patent application Ser. No. 09/113,852, entitled "Method for Forming a Copper Film on a Substrate", by Paranjpe et al., which is incorporated herein by reference.

Although cobalt provides many advantages as a dopant, other dopants and combinations of dopants can be used to optimize barrier qualities. In general, barriers according to the present invention can be represented by the formula: [R1][R2][X1][X2][Y1][Y2][Y3], where R represents a refractory metal selected from the group of tantalum, tungsten, titanium, and chromium; X represents a dopant selected from the group of cobalt, ruthenium, platinum, palladium, iridium, rhodium, and tin; and Y represents an element select from the group of nitrogen, oxygen and carbon. As a minimum, the barrier comprises at least one refractory metal and one dopant (e.g., TaCo). The barrier can also comprise between zero and two refractory metals, and between zero and three of the other elements from the Y group. The table below depicts a number of barrier materials according to the present invention, methods for deposition of the barrier and properties and some properties associated with each barrier material:

| ID | Interconnect Barrier Material (Deposition Methods) | Properties and Impact |
|---|---|---|
| 1 | $Ta_xN_yCo_z$ (plasma PVD, MOCVD, L-MOCVD, PECVD, vacuum arc PVD, IBD) | Good barrier for Cu; Pt content for CMP-proof adhesion of MOCVD-Cu; lower resistivity than TaN due to Co |
| 2 | $Ta_xSn_yN_z$ (plasma PVD, MOCVD, PECVD, vacuum arc PVD, IBD) | Lower resistivity than TaSiN due to Sn instead of Si; near amorphous microstructure for excellent barrier properties |
| 3 | $Ti_xSn_yN_z$ (plasma PVD, MOCVD, PECVD, vacuum arc PVD, IBD) | Lower resistivity than TiSiN due to Sn instead of Si; near amorphous microstructure for excellent barrier properties |
| 4 | $Ti_xSn_yN_zCo_w$ (plasma PVD, MOCVD, PECVD, vacuum arc PVD, IBD) | Good CMP-proof copper adhesion; near-amorphous microstructure for good barrier; lower resistivity due to Co |
| 5 | $Cr_xC_yCo_z$ (plasma PVD, MOCVD, PECVD, vacuum arc PVD, IBD) | Good barrier for Cu; good CMP-proof MOCVD-Cu adhesion due to Pt; lower resistivity than CrC due to Co |
| 6 | $Cr_xCo_yCo_z$ (plasma PVD, MOCVD, PECVD, vacuum arc PVD, IBD) | Good diffusion barrier for Cu; excellent CMP-proof MOCVD-Cu adhesion due to Co |
| 7 | $Co_xPt_y$ (plasma PVD, MOCVD, PECVD, vacuum arc PVD, IBD) | Good diffusion barrier for Cu; excellent CMP-proof MOCVD-Cu adhesion due to Pt and Co |

-continued

| ID | Interconnect Barrier Material (Deposition Methods) | Properties and Impact |
|---|---|---|
| 8 | $Ta_xCo_y$ (plasma PVD, MOCVD, PECVD, vacuum arc PVD, IBD) | Superior MOCVD-Cu adhesion compared to Ta barrier; good diffusion barrier properties |
| 9 | $W_xN_yCo_z$ (plasma PVD, MOCVD, PECVD, vacuum arc PVD, IBD) | Superior barrier to WN for CMP-proof adhesion of MOCVD-Cu; lower resistivity barrier |
| 10 | $Ta_xSn_yN_zCo_w$ (plasma PVD, MOCVD, PECVD, vacuum arc PVD, IBD) | Good CMP-proof adhesion of MOCVD-Cu; near-amorphous material for good barrier properties; low resistivity due to Co and Sn |
| 11 | $W_xSn_yN_z$ (plasma PVD, MOCVD, PECVD, vacuum arc PVD, IBD) | Good ternary barrier properties due to near-amorphous microstructure; lower resistivity than WSiN due to Sn |
| 12 | $W_xSn_yN_zCo_w$ (plasma PVD, MOCVD, PECVD, vacuum arc PVD, IBD) | Good CMP-proof adhesion of MOCVD-Cu; near-amorphous microstructure for good barrier; lower resistivity than WSiN |

Following the deposition, the barrier surface may be treated, such as by thermal annealing or plasma treatment, to selectively passivate some of the surface elements. For example, for a TaCo barrier, a thermal or plasma oxidation following deposition will passivate the Ta. Thus, the barrier surface would behave more as a Co surface than a TaCo surface with respect to subsequent metallization. This advantageously enhances adhesion, particularly for copper overlayers.

Barrier layer 26 may also be configured using other types of metal for providing good adhesion of copper overlays. For example, cobalt-containing barrier 26 of FIG. 2 may be configured as a cobalt, cobalt alloy, ruthenium, or ruthenium alloy layer.

Barrier layer 26 may be deposited using conventional methods such as chemical vapor deposition (CVD) or physical vapor deposition (PVD) to a predetermined thickness. In one embodiment, barrier layer 26 may include TaN, TiN, WNx or other materials for creating barrier layers configured to provide conductivity while maintaining a diffusion barrier. Adhesion region 29 of barrier layer 26 is preferably made of cobalt or cobalt based alloys and promotes excellent adhesion and uniform nucleation of copper layer 28 during a deposition process. For example, adhesion region 29 may be comprised of 50 Å of cobalt or cobalt alloys to allow reduced nucleation delay times of less than 30 seconds during deposition of 100 to 250 Å of copper to create copper layer 28.

In one embodiment, adhesion region 29 may have a graded composition through its thickness thereby providing greater proportion of cobalt adjacent to copper layer 28 than is adjacent to barrier layer 26. For example, adhesion region 29 may be more cobalt rich adjacent to copper layer 28 to provide a good nucleation and adhesion surface for copper deposition. Varied concentrations of cobalt within adhesion region 29 provide a graded composition that can be achieved through co-deposition of adhesion region 29 with barrier layer 26. For example, an adhesion region comprised of cobalt may be co-deposited with a barrier layer comprised of TiN and TaN and WN. A variance in the rate of deposition and concentration of materials used during the deposition process can provide desirable concentration levels of materials between the copper layer and barrier layer 26. Co-deposition techniques are discussed in greater detail in U.S. patent application Ser. No. 09/113,852, entitled "Method for Forming a Copper Film on a Substrate", by Paranjpe et al., which is incorporated herein by reference.

In one embodiment of the present invention a method of fabricating an interconnect having a barrier layer with an adhesion region is disclosed. The method includes depositing barrier layer 26 using a physical vapor deposition technique to a predetermined thickness. Physical vapor deposition of barriers include depositing TaSiN, TiSiN, WSiN, etc. Upon depositing barrier layer 26, adhesion region 29 may be deposited using a chemical vapor deposition process or a PVD process. Copper may then be deposited using a CVD copper process. In a preferred embodiment, a metalorganic chemical vapor deposition process (MOCVD) that includes utilizing organometallic liquid precursors is used for the copper deposition.

The CVD copper deposition process is performed using a MOCVD copper chamber having a warm wall stainless steel chamber regulated at a temperature of preferably 50° C. to 70° C. Reactants are introduced through a temperature controlled multi-zone or single-zone showerhead and the substrate is positioned on a heated chuck with the chuck having a backside He gas flow. The substrate is clamped to ensure good thermal contact and uniform substrate temperature. A turbo molecular pump provides a good base pressure while a dry pump is used to pump process gases during the process. The chamber is pumped down to $10^{-6}$ Torr prior to deposition using a turbo molecular pump and a roughing pump is used during the deposition process.

The MOCVD process utilizes organometallic liquid precursors with helium serving as the carrier/diluent gas. A liquid precursor is delivered via a single channel liquid delivery system. In one embodiment, an S-100 precursor is used and includes a shortened nucleation delay. For example, a nucleation delay of less than 30 seconds can be used for the deposition process. A substrate is loaded into a CVD Cu module and exposed to a 10 second burst of precursor diluted in a carrier gas. Alternatively, the wafer may be allowed to soak in a dilute precursor containing ambient prior to, during, or following heating the wafer. The process proceeds by providing a backside gas to the backside of the substrate and heating the substrate for seventy seconds in the dilute precursor containing ambient. The process proceeds by providing a precursor/carrier flow introduced for a 30–120 second deposition period.

The deposition process conditions include: 0.15 cc/min S-100, 100 sccm carrier He, 200 sccm purge He, 10 sccm backside He, 0.75 Torr chamber pressure, 180° C./212° C. chuck temperature (substrate temperature of ~175° C.), 0.2" showerhead to substrate spacing, and ATMI vaporizer temperature of 80° C. In addition, 10 sccm of wet He (generated by flowing 10 sccm of He through a water containing bubbler maintained at room temperature and 30 psig) is added during the 10 second precursor burst step as well as during the main deposition step.

In an alternate embodiment, a Cupraselect precursor may be used during the deposition process. Cupraselect is deposited using a CVD copper process having deposition conditions that include: 0.4 cc/min Cupraselect, 100 sccm carrier He, 200 sccm purge He, 15 sccm backside He, 0.75 Torr, 205° C./240° C. chuck temperature (wafer temperature of ~200° C.), 0.2" showerhead to wafer spacing, and ATMI vaporizer temperature of 64° C. In one embodiment, using CUPRASELECT allows for a wide temperature range of up to 165° C./195° C. for CVD deposited copper.

In an alternate embodiment, a CVD copper layer is deposited onto a PVD deposited adhesion region comprised of Co or cobalt alloys such as $Co_{90}Zr_5Ta_5$ and $Co_{82}Cr_6Pt_{12}$. The cobalt based adhesion region 29 may be deposited during a PVD process. A nucleation delay of less than ninety seconds is used for 50 Å PVD Co. In one embodiment, barrier layer 26 and the cobalt based adhesion region 29 may be co-deposited within the same PVD process. The process proceeds by creating a copper layer 28 using a CVD copper process as described above. In this manner a PVD process for depositing a barrier layer having an adhesion region comprised of cobalt may be used in conjunction with a CVD process for depositing copper thereby providing a continuous, adherent interconnect structure.

The above process results in CVD Cu films with $R_s$ ranging from 2/sq to 5/sq for 250–150 Å CVD Cu deposited on 50 Å PVD Co. The 150–250 Å CVD Cu region may be further electroplated providing continuous CVD Cu film on PVD Co adhesion region. The resulting interconnect when exposed to a post-deposition anneal at 400° C. confirms that the resistivity of CVD Cu on PVD Co does not increase upon annealing. In other words, cobalt and copper do not inter-diffuse at elevated temperatures since the two elements are generally immiscible. Hence the low resistivity of copper is retained. In fact, a decrease in resistivity of CVD Cu on PVD Co may be observed.

In a preferred embodiment, an interconnect may be formed using an all CVD process for fabricating adhesion region 29, barrier layer 26, and a copper layer 28. Adhesion region 29 may be deposited in a CVD barrier module using a cobalt based precursor such as $Co(Co)_3NO$. The CVD barrier module includes a warm-wall stainless steel chamber with wall temperature regulated at 40° C. Reactants are introduced through a temperature controlled multi-zone showerhead. A two-zone resistively heated chuck with backside Ar gas flow and substrate clamping ensures good thermal contact and uniform substrate temperature. A turbo molecular pump is used for achieving good base pressure while a dry pump is used to pump the process gases during the process. The chamber was pumped down to $10^{-6}$ Torr prior to the deposition using the turbo molecular pump. The cobalt precursor is sublimed in a bubbler (held at 0° C.) and metered by a vapor source MFC. Excess $H_2$ is used as the diluent gas. The deposition process conditions for the cobalt based adhesion region process may include: 1 sccm $Co(CO)_3NO$, ~500 sccm diluent $H_2$, 15 sccm backside Ar, 1–2 Torr and 410° C. wafer temperature.

In an alternate embodiment, a CVD process may be used to co-deposit barrier layer 26 and adhesion region 29. Adhesion region 29 may have a graded composition through its thickness having a profile with a greater proportion of cobalt adjacent to copper layer 28 than is adjacent to adhesion region 29. For example, adhesion region 29 may be more cobalt rich adjacent to the metal layer to provide a good nucleation and adhesion surface for a metal deposition, with reduced cobalt doping at adhesion region 29 to retain optimal barrier properties. Varied concentrations of cobalt within adhesion region 29 provide a gradient that can be achieved through co-deposition of adhesion region 29 with adhesion region 29 during the CVD process. For example, an adhesion region comprised of cobalt may be co-deposited with a adhesion region comprised of TiN, TaN, or WN. A variance in the rate of deposition and concentration of materials used during the deposition process can provide gradients between the metal layer and the adhesion region.

In another embodiment, a CVD process may be provided to co-deposit an adhesion region 29 of cobalt and a copper layer 28. Adhesion region 29 and/or copper layer 28 may have a graded composition through its thickness having a profile with a greater proportion of cobalt adjacent to copper layer 28 than is adjacent to adhesion region 29. For example, adhesion region 29 may be more cobalt rich adjacent to the metal layer to provide a good nucleation and adhesion surface for a copper deposition.

Therefore, the disclosed all CVD process for fabricating of copper interconnect provides good adhesion of a metal layer, such as copper, to an adhesion region, such as cobalt or cobalt-based alloys. Additionally, a CVD based adhesion layer adheres well to underlayers comprised of $SiO_2$ and CVD barriers.

In a preferred embodiment, a thin adhesion region comprising cobalt (<50 Å) may be provided as an adhesion region for a CVD Cu layer. In one embodiment, CVD Co may be deposited in the CVD barrier module or in another embodiment CVD Co may be deposited in a CVD Cu module, thereby providing a thin adhesion region of cobalt deposited in a CVD module between a CVD barrier and CVD Cu layer. The cobalt adhesion layer may also be provided using a separate CVD cluster module.

Additionally, the process conditions for CVD Co are compatible with those of TaN when $Co(CO)_3NO$ is used as the precursor, it is possible to co-deposit CVD Co with the barrier to eliminate the CVD barrier/CVD Co interface. Analogously, since the process conditions for CVD Co are compatible with those of CVD Cu when $Co_2(CO)_8$ is used as the precursor, it is possible to co-deposit CVD Co with CVD Cu to eliminate the CVD Co/CVD Cu interface. This method is extendible to other elements/alloys (e.g. Pt and Fe based materials) that also share the desired characteristics for glue/nucleation layers. Other precursors for Co can also be used such as $CpCo(CO)_2.NH_3$ can be used as a reducing gas together with or in place of $H_2$.

Ruthenium and ruthenium-based alloys may also be used as an adhesion region. A method to simultaneously achieve 150–250 Å continuous, conformal and well adherent CVD Cu to CVD barriers using an ultra-thin (<50 Å) glue/nucleation layer of CVD Ru (or Ru based alloys) is disclosed. The CVD Ru may be deposited in a barrier module or prior to CVD Cu in a CVD Cu module. Alternatively CVD Ru may be co-deposited either with the CVD barrier in the CVD barrier module or the CVD ruthenium may be co-deposited with the CVD Cu in the CVD Cu module. Therefore, the present invention enables an all CVD approach for ruthenium, ruthenium alloy, cobalt, or cobalt alloy adhesion regions for copper based interconnects.

In one embodiment of the present invention, CVD deposited cobalt or ruthenium may be desirable over PVD processes for promoting adhesion of copper. Impurity levels associated with CVD processes may promote the adhesion of copper. For example, a CUPRASELECT CVD Cu to CVD Co process having an increased level of impurities promotes adhesion of the CVD copper. Impurities such as C, O, and H associated with a CVD Cu process aid in promoting adhesion of copper to an adhesion region comprised of cobalt, cobalt alloys, ruthenium, or ruthenium alloys and may be desirable in predetermined amounts for providing conformal and adherent microelectronic interconnect structures comprised of copper.

Although the present invention has been described in detail, it should be understood that various changes, substitutions and alterations can be made hereto without departing from the spirit and scope of the invention as defined by the appended claims.

What is claimed is:

1. A method for fabrication of a microelectronic device on a substrate, the method comprising:
   depositing a barrier layer on the substrate, the barrier layer operable to limit diffusion of copper to the substrate;
   depositing a cobalt layer over the barrier layer; and
   depositing a copper layer over the cobalt layer, the copper layer deposited with a chemical vapor deposition precursor.

2. The method of claim 1 wherein depositing a copper layer further comprises depositing the copper layer with a metal-organic precursor.

3. The method of claim 2 wherein depositing the cobalt layer further comprises depositing the cobalt layer with a chemical vapor deposition precursor.

4. The method of claim 3 wherein the cobalt chemical vapor deposition precursor comprises $Co(CO)_3NO$.

5. The method of claim 3 wherein the cobalt chemical vapor deposition precursor comprises $Co_2(CO)_8$.

6. The method claim 3 wherein depositing the barrier layer further comprises depositing the barrier layer with a chemical vapor deposition precursor.

7. The method of claim 6 further comprising:
   co-depositing the barrier layer and the cobalt layer by flowing the cobalt precursor with the barrier precursor and then ending the barrier precursor flow.

8. The method of claim 7 wherein the barrier layer comprises TaN and the cobalt precursor comprises $Co(CO)_3NO$.

9. The method of claim 8 further comprising:
   co-depositing the cobalt layer and the copper layer by flowing the copper precursor with the cobalt precursor and then ending the cobalt precursor flow.

10. The method of claim 9 wherein the cobalt precursor comprises $Co_2(CO)_8$.

11. The method of claim 6 further comprising:
    co-depositing the cobalt layer and the copper layer by flowing the copper precursor with the cobalt precursor and then ending the cobalt precursor flow.

12. The method of claim 9 wherein the cobalt precursor comprises $Co_2(CO)_8$.

13. The method of claim 2 wherein the microelectronic device comprises an integrated circuit interconnect structure.

14. A method for fabricating an electronic device on a semiconductor substrate, the electronic device having a conductive copper structure, the method comprising:
    flowing a barrier precursor over the substrate to deposit a barrier material on the substrate, the barrier material reducing diffusion of copper into the substrate;
    flowing a cobalt precursor over the substrate to deposit cobalt on the barrier material; and
    flowing a copper precursor over the substrate to deposit copper on the cobalt.

15. The method of claim 14 further comprising:
    overlapping the flows of the barrier precursor and the cobalt precursor to deposit a graded composition of barrier material and cobalt between the barrier material and the cobalt material.

16. The method of claim 15 further comprising:
    overlapping the flows of the cobalt precursor and the copper precursor to deposit a graded composition of cobalt and copper between the cobalt material and the copper material.

17. The method of claim 14 further comprising:
    overlapping the flows of the cobalt precursor and the copper precursor to deposit a graded composition of cobalt and copper between the cobalt material and the copper material.

18. The method of claim 17 further comprising:
    overlapping the flows of the barrier precursor and the cobalt precursor to deposit a graded composition of barrier material and cobalt between the barrier material and the cobalt material;
    wherein the cobalt precursor comprises a first precursor for overlapping with the barrier precursor and a second precursor for overlapping with the copper precursor.

19. The method of claim 18 wherein the barrier material comprises TaN, the first cobalt precursor comprises $Co(CO)_3NO$ and the second cobalt precursor comprises $Co_2(CO)_8$.

20. The method of claim 19 wherein the copper precursor comprises a metal-organic precursor.

21. The method of claim 14 wherein the electronic device comprises an integrated circuit.

22. The method of claim 21 wherein the structure comprises a copper interconnect.

* * * * *